US009837557B2

(12) United States Patent
Bae

(10) Patent No.: US 9,837,557 B2
(45) Date of Patent: Dec. 5, 2017

(54) SOLAR CELL APPARATUS AND METHOD OF FABRICATING THE SAME

(71) Applicant: LG INNOTEK CO., LTD., Seoul (KR)

(72) Inventor: Do Won Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/367,055

(22) PCT Filed: Dec. 13, 2012

(86) PCT No.: PCT/KR2012/010871
§ 371 (c)(1),
(2) Date: Jun. 19, 2014

(87) PCT Pub. No.: WO2013/094937
PCT Pub. Date: Jun. 27, 2013

(65) Prior Publication Data
US 2014/0311565 A1  Oct. 23, 2014

(30) Foreign Application Priority Data
Dec. 19, 2011  (KR) ......... 10-2011-0137800

(51) Int. Cl.
*H01L 31/00*  (2006.01)
*H01L 31/02*  (2006.01)
(Continued)

(52) U.S. Cl.
CPC ........ *H01L 31/0201* (2013.01); *H01L 31/046* (2014.12); *H02S 40/34* (2014.12); *Y02E 10/50* (2013.01)

(58) Field of Classification Search
CPC ... H01L 31/0201; H01L 31/046; H02S 40/34; Y02E 10/50
See application file for complete search history.

(56) References Cited

U.S. PATENT DOCUMENTS

| 6,441,301 | B1 | 8/2002 | Satoh et al. |
| 2007/0056625 | A1 | 3/2007 | Higuchi et al. |

(Continued)

FOREIGN PATENT DOCUMENTS

| CN | 1319897 A | 10/2001 |
| CN | 1933186 A | 3/2007 |

(Continued)

OTHER PUBLICATIONS

Definition of on.*

(Continued)

*Primary Examiner* — Tamir Ayad
*Assistant Examiner* — Uyen Tran
(74) *Attorney, Agent, or Firm* — Saliwanchik, Lloyd & Eisenschenk

(57) ABSTRACT

A solar cell apparatus according to the embodiment includes a substrate including a top surface and a bottom surface which are opposite to each other; a back electrode layer on the top surface of the substrate; a light absorbing layer on the back electrode layer; a front electrode layer on the light absorbing layer; a connecting member on the bottom surface of the substrate; and a bus bar connected to the connecting member, wherein the bus bar comprises: an electrode contact portion making contact with the back electrode layer; and a substrate contact portion making contact with the substrate.

17 Claims, 2 Drawing Sheets

(51) Int. Cl.
*H01L 31/046* (2014.01)
*H02S 40/34* (2014.01)

(56) References Cited

U.S. PATENT DOCUMENTS

| | | | |
|---|---|---|---|
| 2010/0252109 A1 | 10/2010 | Hong et al. | |
| 2011/0017279 A1* | 1/2011 | Baumbach | H01L 31/02008 136/251 |
| 2011/0259395 A1 | 10/2011 | Wieting et al. | |
| 2012/0180843 A1* | 7/2012 | Park | 136/244 |
| 2012/0216849 A1 | 8/2012 | Cho | |

FOREIGN PATENT DOCUMENTS

| | | | | |
|---|---|---|---|---|
| DE | 102011018268 A1 | | 11/2011 | |
| JP | S63-009157 U | | 1/1988 | |
| JP | 2008066492 | * | 3/2008 | 136/256 |
| KR | 10-2009-0029883 A | | 3/2009 | |
| KR | 10-2010-0069354 A | | 6/2010 | |
| KR | 10-2010-0138299 A | | 12/2010 | |
| KR | 10-2011-0054907 A | | 5/2011 | |
| WO | WO2011040779 | * | 4/2011 | 136/244 |

OTHER PUBLICATIONS

International Search Report in International Application No. PCT/KR2012/010871, filed Dec. 13, 2012.
Office Action dated May 28, 2013 in Korean Application No. 10-2011-0137800, filed Dec. 19, 2011.
Office Action dated Oct. 9, 2015 in Chinese Application No. 201280070031.3.

* cited by examiner

[Fig. 1]
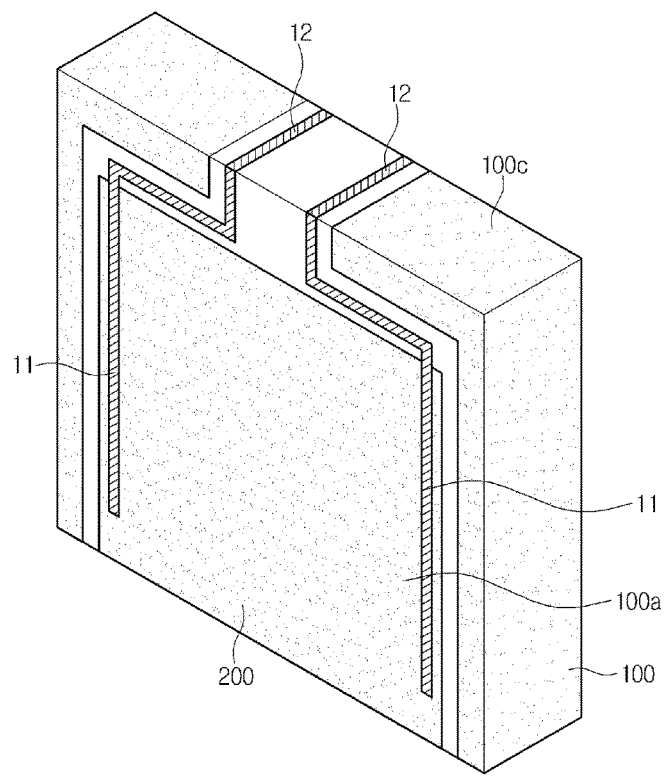
[Fig. 2]
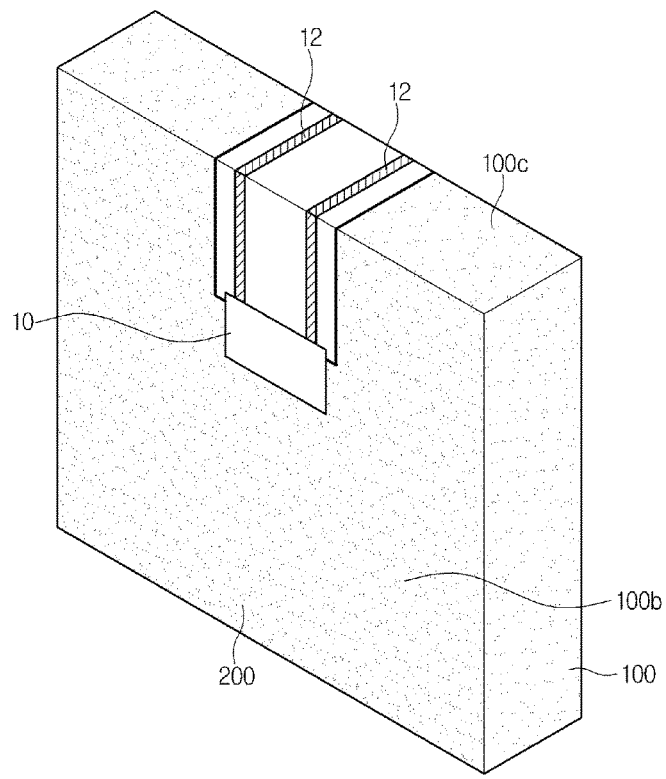

[Fig. 3]
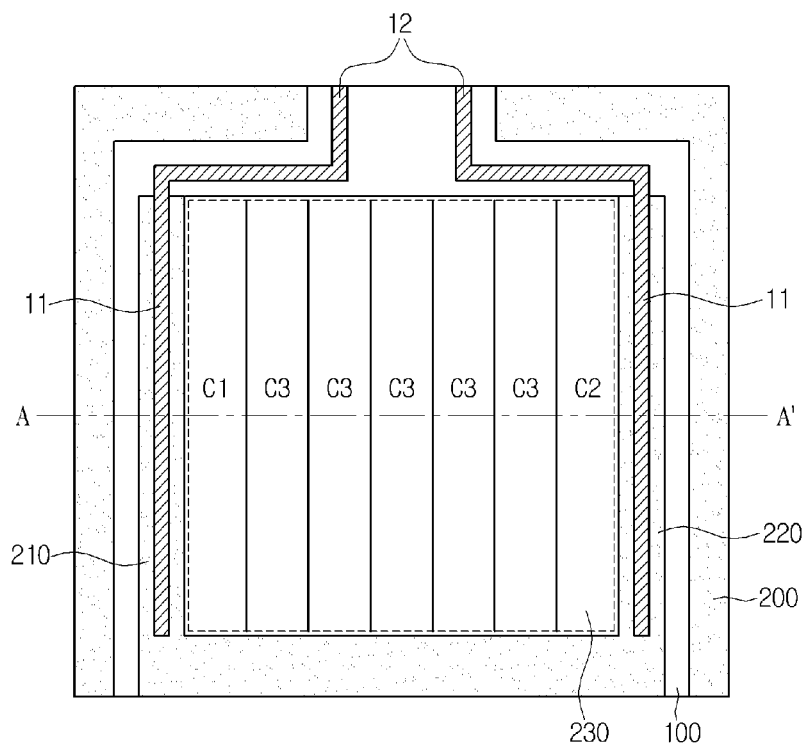
[Fig. 4]
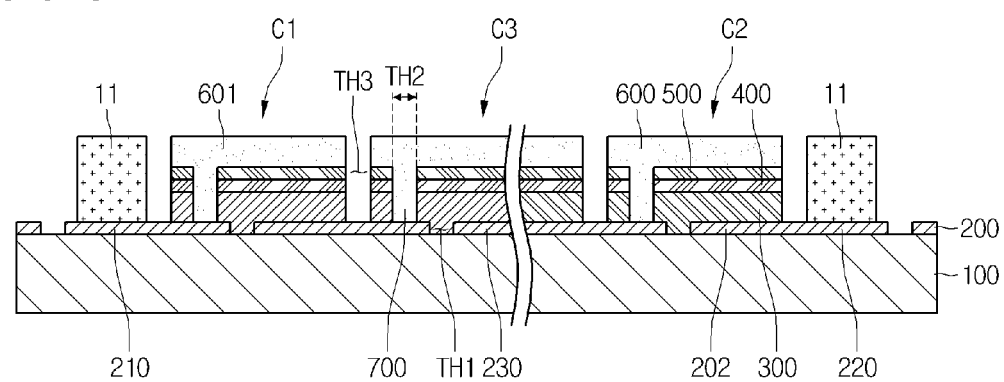

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/010871, filed Dec. 13, 2012, which claims priority to Korean Application No. 10-2011-0137800, filed Dec. 19, 2011, the disclosures of each of which are incorporated herein by reference in their entirety.

TECHNICAL FIELD

The embodiment relates to a solar cell apparatus and a method of fabricating the same.

BACKGROUND ART

Recently, as energy consumption is increased, solar cell apparatuses to convert the solar light into electrical energy have been developed.

In particular, a CIGS-based solar cell, which is a PN hetero junction apparatus having a substrate structure including a glass substrate, a metallic back electrode layer, a P-type CIGS-based light absorbing layer, a high-resistance buffer layer, and an N-type window layer, has been extensively used.

Various studies and researches have been performed to improve electrical characteristics of the solar cell, such as low resistance and high transmittance.

Meanwhile, since a material of a back electrode layer is deposited on the entire surface of a support substrate when forming the back electrode layer, even a portion of a bus bar to be connected with a connecting member makes contact with the back electrode layer. Thus, a shunt path may be caused and the reliability of the solar cell apparatus may be reduced.

DISCLOSURE OF INVENTION

Technical Problem

The embodiment provides a solar cell apparatus having improved reliability

Solution to Problem

According to the embodiment, there is provided a solar cell apparatus including a substrate including a top surface and a bottom surface which are opposite to each other; a back electrode layer on the top surface of the substrate; a light absorbing layer on the back electrode layer; a front electrode layer on the light absorbing layer; a connecting member on the bottom surface of the substrate; and a bus bar connected to the connecting member, wherein the bus bar comprises: an electrode contact portion making contact with the back electrode layer; and a substrate contact portion making contact with the substrate.

According to the embodiment, there is provided a method of fabricating a solar cell apparatus. The method of fabricating a solar cell apparatus includes: preparing a substrate including a top surface and a bottom surface which are opposite to each other; forming a back electrode layer on the top surface of the substrate; forming a light absorbing layer on the back electrode layer; forming a front electrode layer on the light absorbing layer; forming a connecting member on the bottom surface of the substrate; forming a bus bar connected to the connecting member, wherein the bus bar comprises: an electrode contact portion making contact with the back electrode layer; and a substrate contact portion making contact with the substrate.

Advantageous Effects of Invention

As described above, according to the embodiment, the solar cell apparatus includes the bus bar having the substrate contact portion which makes direct contact with the substrate. Thus, a problem, in which even the portion of the bus bar to be connected to the connecting member makes contact with the back electrode layer since the material of the back electrode layer is deposited on the entire surface of the support substrate when forming the back electrode layer, can be prevented. Accordingly, a shunt path can be prevented by the substrate contact portion and the reliability of the solar cell apparatus can be improved.

The method of fabricating the solar cell apparatus according to the embodiment can provide the solar cell apparatus having the above-described effects.

BRIEF DESCRIPTION OF DRAWINGS

FIG. 1 is a perspective view showing a solar cell apparatus according to the embodiment;

FIG. 2 is a perspective view showing a solar cell apparatus according to the embodiment;

FIG. 3 is a front view showing a solar cell apparatus according to the embodiment; and FIG. 4 is a sectional view taken along line A-A'.

MODE FOR THE INVENTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of the layer (or film), the region, the pattern, or the structure does not utterly reflect an actual size.

Hereinafter, the embodiment will be described with reference to accompanying drawings in detail.

The solar cell apparatus according to the embodiment will be described with reference to accompanying drawings in detail with reference to FIGS. 1 to 4.

FIG. 1 is a perspective view showing a solar cell apparatus according to the embodiment. FIG. 2 is a perspective view showing a solar cell apparatus according to the embodiment. FIG. 3 is a front view showing a solar cell apparatus according to the embodiment. FIG. 4 is a sectional view taken along line A-A'.

Referring to FIGS. 1 to 4, the solar cell apparatus includes a support substrate 100, a back electrode layer 200, bus bars 11 and 12, a light absorbing layer 300, a buffer layer 400, a high-resistance buffer layer 500, a window layer 600, and a connecting member 10.

The support substrate 100 has a plate shape and includes a top surface and a bottom surface in opposition to each other. The support substrate 100 supports the back electrode layer 200, the bus bars 11 and 12, the light absorbing layer 300, the buffer layer 400, the high-resistance buffer layer 500, and the window layer 600.

The support substrate 100 may be an insulator. The support substrate 100 may be a glass substrate 100, a plastic substrate 100, or a metal substrate 100. In more detail, the support substrate 100 may be a soda lime glass substrate 100. The support substrate 100 may be transparent. The support substrate 100 may be rigid or flexible.

The back electrode layer 200 is disposed on the top surface of the support substrate 100. The back electrode layer 200 may be a conductive layer. The back electrode layer 200 may include a metal, such as molybdenum (Mo).

In addition, the back electrode layer 200 may include at least two layers. In this case, the layers may be formed by using the homogeneous metal or heterogeneous metals.

Referring to FIG. 4, first through holes TH1 are formed in the back electrode layer 200. The first through holes TH1 are open regions to expose the top surface of the support substrate 100. When viewed in a plan view, the first through holes TH1 may have a shape extending in one direction.

The first through holes TH1 may have a width in the range of about 80 μm to about 200 μm. The back electrode layer 200 is divided into a plurality of back electrodes 230 and two connecting electrodes 210 and 220 by the first through holes TH1. That is, the back electrodes 230, the first connecting electrode 210 and the second connecting electrode 220 are defined by the first through holes TH1. The back electrode layer 200 includes the back electrodes 230, the first connecting electrode 210 and the second connecting electrode 220.

The back electrodes 230 are disposed in an active region. The back electrodes 230 are arranged in parallel with each other. The back electrodes 230 are spaced apart from each other by the first through holes TH1. The back electrodes 230 are arranged in the form of a stripe.

To the contrary, the back electrodes 230 may be arranged in the form of a matrix. In this case, when viewed in a plan view, the first through holes TH1 may be provided in the form of a lattice.

The first and second connecting electrodes 210 and 220 are disposed in an inactive region. That is, the first and second connecting electrodes 210 and 220 extend from the active region into the inactive region.

In more detail, the first connecting electrode 210 is connected to a window of a first cell C1. Further, the second connecting electrode 220 extends from a back electrode of a second cell C2 into the inactive region. That is, the second connecting electrode 220 and the back electrode 202 of the second cell C2 are integrally formed with each other.

Then, the light absorbing layer 300 is disposed on the back electrode layer 200. The light absorbing layer 300 includes a group I-III-VI compound. For example, the light absorbing layer 300 may have a Cu(In,Ga)Se2 (CIGS) crystal structure, a Cu(In)Se2 crystal structure, or a Cu(Ga)Se2 crystal structure.

The light absorbing layer 300 may have an energy bandgap in the range of about 1 eV to about 1.8 eV.

The buffer layer 400 is disposed on the light absorbing layer 300. The buffer layer 400 makes direct contact with the light absorbing layer 300.

The buffer layer 400 may include cadmium sulfide (CdS).

The front electrode layer 600 is provided over the light absorbing layer 300. In more detail, the front electrode layer 600 is provided on the buffer layer 400.

The front electrode layer 600 is disposed on the buffer layer 400. The front electrode layer 600 is transparent.

For example, the front electrode layer 600 may include Al doped zinc oxide (AZO), indium zinc oxide (IZO), or indium tin oxide (ITO).

The front electrode layer 600 may have a thickness in the range of about 500 nm to about 1.5 μm. Further, when the front electrode layer 600 may formed of the Al doped zinc oxide, the aluminum may be doped at a rate in the range of about 1.5 wt % to about 3.5 wt %. The front electrode layer 600 is a conductive layer.

Next, the connecting member 10 is placed on the bottom surface of the support substrate 100. The connecting member 10 may be a junction box.

Although not shown in the drawing, a cable may be further provided. The cable is electrically connected to the solar cell panel 200 through the connecting member 10 and the bus bars 11 and 12. In other words, the cable transfers electrical energy generated from the solar cell panel 200 to a rectifier and/or a battery.

Further, the cable may be connected to a solar cell module adjacent to the cable. That is, a plurality of solar cell modules may be connected to each other through the cable.

The connecting member 10 may include a conductor, an insulator and a bypass diode.

The cable may be connected to the connecting member 10 by solder paste.

Meanwhile, the bus bars 11 and 12 may include a first bus bar and a second bus bar. The first and second bus bars face each other. Further, the first and second bus bars may be symmetrical to each other. The first and second bus bars are conductors. The first and second bus bars may include a high-conductive metal such as silver (Ag).

The first bus bar is disposed in the inactive region. The first bus bar is disposed on the back electrode layer 200. In more detail, the first bus bar is disposed on the first connecting electrode 210. The first bus bar may make direct contact with the top surface of the first connecting electrode 210.

The first bus bar extends in parallel with the first cell C1. The first bus bar may extend to the bottom surface of the support substrate 100 through a hole formed in the support substrate 100. The first bus bar is connected to the first cell C1. In more detail, the first bus bar is connected to the first cell C1 through the connecting electrode 210.

The second bus bar is disposed in the inactive region. The second bus bar is disposed on the back electrode layer 200. In more detail, the second bus bar is disposed on the second connecting electrode 220. The second bus bar may make direct contact with the top surface of the second connecting electrode 220.

The second bus bar extends in parallel with the second cell C2. The second bus bar may extend to the bottom surface of the support substrate 100 through a hole formed in the support substrate 100. In more detail, the second bus bar is connected to the second cell C2 through the second connecting electrode 220.

Next, the bus bars 11 and 12 include an electrode contact portion 11 and a substrate contact portion 12.

The electrode contact portion 11 makes contact with the back electrode layer 200. The electrode contact portion 11 makes contact with the back electrode layer 200 placed beside the light absorbing layer 330.

The substrate contact portion 12 makes contact with the substrate 100. The substrate contact portion 12 extends from the electrode contact portion 11 and is connected to the connecting member 10. The substrate contact portion 12 extends from the top surface 100a of the substrate 100 to the bottom surface 100b of the substrate 100 while passing through a side surface 100c of the substrate 100. The substrate contact portion 12 makes direct contact with the substrate 100.

Thus, a problem, in which even the portion of the bus bars 11 and 12 to be connected to the connecting member 10 makes contact with the back electrode layer 200 since the material of the back electrode layer 200 is deposited on the entire surface of the support substrate 100 when forming the back electrode layer 200, can be prevented. Accordingly, a shunt path can be prevented by the substrate contact portion 12 and the reliability of the solar cell apparatus can be improved and the reliability of the solar cell apparatus can be improved.

Hereinafter, a method of fabricating a solar cell apparatus according to the embodiment will be described. The method of fabricating a solar cell apparatus according to the embodiment may include a step of forming a back electrode layer 200, a step of forming a light absorbing layer 300, a step of forming a buffer layer 400, and a step of forming a front electrode layer 600.

First, a metal such as molybdenum (Mo) is deposited on a substrate 100 through a sputtering process, such that the back electrode layer 200 is formed.

Generally, the back electrode layer 200 may be formed by performing processes twice while varying the process conditions.

Meanwhile, an additional layer such as an anti-diffusion layer may be interposed between the support substrate 100 and the back electrode layer 200.

In the step of forming the back electrode layer 200, after forming a mask on a portion at which the substrate contact portion 12 will be placed later, the back electrode layer 200 may be deposited thereon. In general, the material of the back electrode layer 200 is deposited on the entire surface of the support substrate 100. Thus, when forming the bus bars 11 and 12 later, the material of the back electrode layer 200 is deposited on even a portion of the bus bars 11 and 12 to be connected to the connecting member 10, so that the shunt path may be caused. For this reason, after forming the mask on the portion of the bus bars 11 and 12 at which the substrate contact portion 12 will be placed later, the deposition process is performed such that the material of the back electrode layer 200 may not be deposited on the portion of the bus bars 11 and 12.

However, the embodiment is not limited the above. For instance, when forming the bus bars 11 and 12, the back electrode layer 200 formed on the portion of the bus bars 11 and 12 corresponding to the substrate contact portion 12 may be removed.

When removing the back electrode layer 200, the back electrode layer 200 formed on the portion on which the substrate contact portion 12 will be formed may be sandblasted or etched. Further, the back electrode layer 200 may be removed through grinding.

Then, the light absorbing layer 300 is formed on the back electrode layer 200. The light absorbing layer 300 may be formed through a sputtering process or an evaporation process.

For example, various schemes, such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed, have been extensively used in order to form the light absorbing layer 300.

Regarding the details of the selenization process after the formation of the metallic precursor layer, the metallic precursor layer is formed on the back electrode 200 through a sputtering process employing a Cu target, an In target, or a Ga target.

Thereafter, the metallic precursor layer is subject to the selenization process so that the Cu(In,Ga)Se2 (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or Cu and Ga targets and the selenization process.

Then, the step of forming the buffer layer 400 on the light absorbing layer 300 is performed. Here, the buffer layer 400 is formed by depositing CdS on the light absorbing layer 300 through a sputtering process or a CBD (Chemical Bath De-position) scheme.

Thereafter, the high resistance buffer layer 500 may be formed by depositing zinc oxide on the buffer layer 400 through a sputtering process.

The buffer layer 400 and the high resistance buffer layer 500 are deposited at a thin thickness. For example, the thickness of the buffer layer 400 and the high resistance buffer layer 500 is in the range of about 1 nm to about 80 nm.

Then, the step of forming the front electrode layer 600 on the buffer layer 400 is performed. The front electrode layer 600 may be formed by depositing a transparent conductive material such as aluminum (Al) doped zinc oxide (AZO) on the buffer layer 400 through a sputtering process.

Then, the step of forming the connecting member 10 on the bottom surface of the substrate 100 and a step of forming the bus bars 11 and 12 connected to the connecting member 10 may be performed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
a substrate including a top surface, a bottom surface which are opposite to the top surface, and a side surface connecting the top surface and the bottom surface;
a back electrode layer including a first back electrode layer directly on the top surface of the substrate, and a second back electrode layer directly on the bottom surface of the substrate, and a third back electrode layer directly on the side surface of the substrate;
a light absorbing layer on the back electrode layer;
a front electrode layer on the light absorbing layer;
a connecting member on the bottom surface of the substrate; and
a bus bar connected to the connecting members;
wherein the back electrode layer includes back electrodes, a first connecting electrode, and a second connecting electrode;
wherein the solar cell apparatus further comprises open regions comprising a top open region on the top surface of the substrate, a rear open region on the bottom surface of the substrate, and a side open region on the side surface of the substrate;
wherein each of the back electrodes is spaced apart by the top open region; wherein the second back electrode layer includes the rear open region to expose the bottom surface of the substrate;
wherein the third back electrode layer includes the side open region to expose the side surface of the substrate;
wherein the bus bar comprises:
two electrode contact portions making contact with the back electrode layer; and
two substrate contact portions that are symmetrical to each other and are in direct physical contact with the top surface of the substrate, the side surface of the substrate, and the bottom surface of the substrate;
wherein each substrate contact portion extends from the top surface of the substrate to the bottom surface of the substrate through the side surface of the substrate;
wherein each substrate contact portion includes a first substrate contact portion in the rear open region of the second back electrode layers;
wherein each substrate contact portion further includes a second substrate contact portion in the side open region of the third back electrode layer;
wherein each electrode contact portion protrudes toward the front electrode layer;
wherein the first connecting electrode makes contact with the front electrode layer through a through hole; and
wherein the connecting, member is disposed on the back electrode layer and on the rear open region in the bottom surface of the substrate.

2. The solar cell apparatus of claim 1, wherein each electrode contact portion makes contact with the back electrode layer disposed beside the light absorbing layer.

3. The solar cell apparatus of claim 1, wherein each substrate contact portion extends from the electrode contact portions, respectively, and is connected to the connecting member.

4. The solar cell apparatus of claim 1, wherein each electrode contact portion makes direct contact with the back electrode layer.

5. The solar cell apparatus of claim 1, wherein the bus bar makes contact with the back electrode layer on the top surface of the substrate and the connecting member on the bottom surface of the substrate.

6. The solar cell apparatus of claim 1, wherein the back electrodes are disposed in an active region.

7. The solar cell apparatus of claim 1, wherein the first connecting electrode and the second connecting electrode are disposed in an inactive region.

8. The solar cell apparatus of claim 1, wherein the two electrode contact portions make contact with the first connecting electrode and the second connecting electrode, respectively.

9. The solar cell apparatus of claim 1, wherein each electrode contact portion is disposed in an inactive region.

10. The solar cell apparatus of claim 1, wherein each substrate contact portion is disposed in an inactive region.

11. The solar cell apparatus of claim 1, wherein the connecting member is a junction box.

12. The solar cell apparatus of claim 1, wherein the connecting member includes a conductor, an insulator, and a bypass diode.

13. The solar cell apparatus of claim 1, wherein the bus bar includes a first bus bar and a second bus bar.

14. The solar cell apparatus of claim 13, wherein the first bus bar and the second bus bar are symmetrical to each other.

15. The solar cell apparatus of claim 1, wherein the light absorbing layer has a $Cu(In,Ga)Se_2$ (CIGS) crystal structure, a $Cu(In)Se_2$ crystal structure, or a $Cu(Ga)Se_2$ crystal structure.

16. The solar cell apparatus of claim 1, wherein the light absorbing layer has an energy bandgap in a range of about 1 eV to about 1.8 eV.

17. The solar cell apparatus of claim 1, wherein the front electrode layer is transparent.

* * * * *